(12) United States Patent
Jo et al.

(10) Patent No.: US 10,360,950 B2
(45) Date of Patent: Jul. 23, 2019

(54) METHODS, SEMICONDUCTOR DEVICES, AND SEMICONDUCTOR SYSTEMS

(71) Applicant: SK hynix Inc., Icheon-si, Gyeonggi-do (KR)

(72) Inventors: Sang Gu Jo, Bucheon-si (KR); Donggun Kim, Hwaseong-si (KR); Yong Ju Kim, Seoul (KR); Do-Sun Hong, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 141 days.

(21) Appl. No.: 15/439,186

(22) Filed: Feb. 22, 2017

(65) Prior Publication Data

US 2017/0365303 A1    Dec. 21, 2017

(30) Foreign Application Priority Data

Jun. 17, 2016 (KR) ........................ 10-2016-0076051

(51) Int. Cl.
| | |
|---|---|
| *G11C 29/00* | (2006.01) |
| *G11C 7/10* | (2006.01) |
| *G11C 8/18* | (2006.01) |
| *G11C 29/52* | (2006.01) |
| *G06F 11/10* | (2006.01) |
| *G11C 29/44* | (2006.01) |
| *G11C 29/04* | (2006.01) |

(52) U.S. Cl.
CPC ............. *G11C 7/10* (2013.01); *G06F 11/1048* (2013.01); *G11C 8/18* (2013.01); *G11C 29/44* (2013.01); *G11C 29/52* (2013.01); *G11C 2029/0411* (2013.01)

(58) Field of Classification Search
CPC .. G11C 7/10; G11C 8/18; G11C 29/44; G06F 11/1048
See application file for complete search history.

(56) References Cited

U.S. PATENT DOCUMENTS

| | | | | |
|---|---|---|---|---|
| 6,275,346 | B1* | 8/2001 | Kim ................. | G11B 20/10009 360/31 |
| 7,477,545 | B2* | 1/2009 | Tu .......................... | G11C 29/88 365/185.05 |
| 7,606,070 | B2* | 10/2009 | Mokhlesi ............ | G11C 11/5642 365/185.17 |
| 7,715,255 | B2* | 5/2010 | Tu .......................... | H01L 22/20 365/185.04 |
| 7,943,723 | B2* | 5/2011 | Ritter ...................... | C07C 51/02 528/206 |
| 8,555,027 | B2* | 10/2013 | Kimura ................ | G06F 11/108 711/206 |
| 8,773,924 | B2* | 7/2014 | Roy ......................... | G11C 7/12 365/154 |
| 9,280,301 | B2* | 3/2016 | Bao ........................ | G06F 3/0619 |
| 9,501,343 | B2* | 11/2016 | Kim ........................ | G11C 16/10 |
| 9,685,206 | B2* | 6/2017 | Choi ................... | G11C 11/5642 |
| 2014/0040683 | A1 | 2/2014 | Roohparvar et al. | |
| 2014/0082459 | A1 | 3/2014 | Li et al. | |

* cited by examiner

*Primary Examiner* — Esaw T Abraham
(74) *Attorney, Agent, or Firm* — William Park & Associates Ltd.

(57) ABSTRACT

A semiconductor device may be provided. The semiconductor device may be configured to shift storage positions of data and error information on the data to store the data into shifted storage positions based on the address signals having a certain combination being inputted a predetermined number of times.

12 Claims, 7 Drawing Sheets

FIG. 4

| NUMBER OF INPUT TIMES OF CONTROL SIGNAL | LD<1> | LD<2> | LD<3> | LD<4> | LD<5> | LD<6> | LD<7> | LD<8> |
|---|---|---|---|---|---|---|---|---|
| 0 | ECP<1> | ECD<2> | ECD<3> | ECD<4> | ECP<1> | ECP<2> | SFT<1> | SFT<2> |
| 1 | ECP<2> | ECD<1> | ECD<2> | ECD<3> | ECD<4> | ECD<1> | SFT<1> | SFT<3> |
| 2 | ECP<1> | ECP<2> | ECD<1> | ECD<2> | ECD<3> | ECD<4> | SFT<1> | SFT<2> |
| 3 | ECD<4> | ECP<1> | ECP<2> | ECD<1> | ECD<2> | ECD<3> | SFT<1> | SFT<2> |
| 4 | ECD<3> | ECD<4> | ECP<1> | ECP<2> | ECD<1> | ECD<2> | SFT<1> | SFT<2> |

METHODS, SEMICONDUCTOR DEVICES, AND SEMICONDUCTOR SYSTEMS

CROSS-REFERENCE TO RELATED APPLICATIONS

The present application claims priority under 35 U.S.C 119(a) to Korean Patent Application No. 10-2016-0076051, filed on Jun. 17, 2016, which is incorporated herein by reference in its entirety.

BACKGROUND

1. Technical Field

Embodiments of the present disclosure may generally relate to semiconductor devices and/or methods for shifting storage positions of data and a parity bit according to the number of times of a write operation and semiconductor systems including the semiconductor devices and/or methods.

2. Related Art

Semiconductor devices may be designed and fabricated to include a test mode function for evaluating the operation thereof. That is, various parameters of the semiconductor devices may be measured in a test mode at a wafer level or at a package level. The tested semiconductor devices may be sorted into good chips or failed chips according to the test results.

Each of the semiconductor devices may execute a write operation and a read operation to receive and output a plurality of data through pads. Each semiconductor device may be evaluated by sensing logic levels of the data outputted from the pads.

As the semiconductor devices become more highly integrated with the development of fabrication process techniques, the number of failed memory cells in the tested semiconductor devices has been increasing. An increase in the number of failed memory cells within the tested semiconductor devices may lead to not only a reduction in the production yield of the semiconductor devices but also difficulty in guaranteeing a large memory capacity for the semiconductor devices. Accordingly, error correction code (ECC) circuits have been widely employed in the semiconductor devices to solve data errors which is due to the failed memory cells.

SUMMARY

According to an embodiment, a semiconductor system may be provided. According to an embodiment, a semiconductor device may be provided. The semiconductor device may be configured to shift storage positions of data and error information on the data to store the data into shifted storage positions based on the address signals having a certain combination being inputted a predetermined number of times.

According to an embodiment, there may be provided a method of receiving and outputting data. The method may include starting a write operation based on a command signal. The method may include comparing the number of times that address signals having a certain combination are inputted with a predetermined number of times during the write operation, and converting data. Converting the data may include generating a control signal including a pulse which is generated based on the address signals having a certain combination being inputted the predetermined number of times or more, generating shifting signals which are counted whenever the address signals having a certain combination are inputted the predetermined number of times or more, and shifting the data and error information on the data by the number of times that the pulse of the control signal is generated to generate internal data.

BRIEF DESCRIPTION OF THE DRAWINGS

FIG. 4 is a table illustrating a representation of an example of an operation of a latch circuit included in the data conversion circuit of FIG. 3.

DETAILED DESCRIPTION

Various embodiments of the present disclosure will be described hereinafter with reference to the accompanying drawings. However, the embodiments described herein are for illustrative purposes only and are not intended to limit the scope of the present disclosure.

Various embodiments may be directed to semiconductor devices shifting storage positions of data and a parity signal if a page located at the same position is selected a predetermined number of times or more to store the data and the parity signal, and semiconductor systems including the same.

Figure 1:
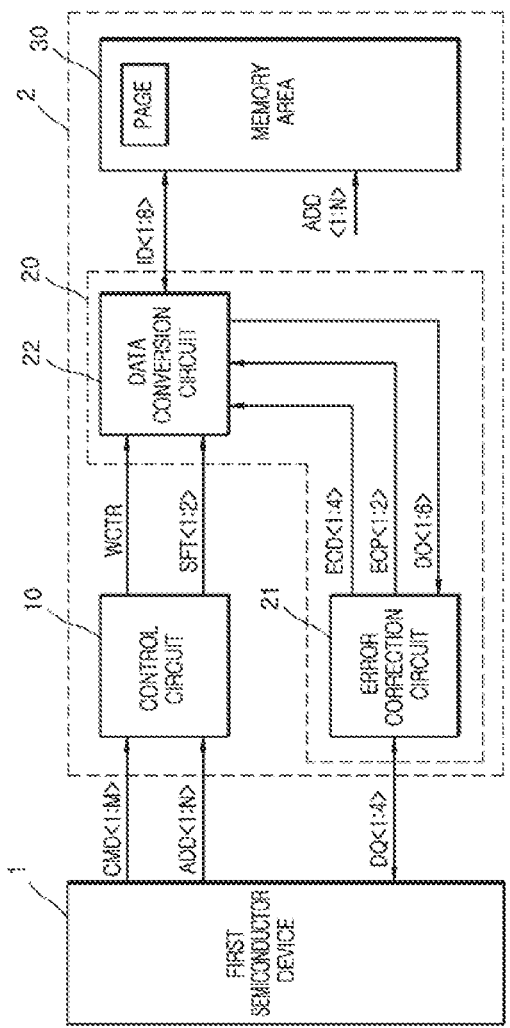
FIG. 1 is a block diagram illustrating a representation of an example of a configuration of a semiconductor system according to an embodiment of the present disclosure.

Referring to FIG. 1, a semiconductor system according to an embodiment of the present disclosure may include a first semiconductor device 1 and a second semiconductor device 2. The second semiconductor device 2 may include a control circuit 10, a data input/output (I/O) circuit 20, and a memory area 30.

The first semiconductor device 1 may output first to $M^{th}$ command signals CMD<1:M> and first to $N^{th}$ address signals ADD<1:N>. The first semiconductor device 1 may receive or output first to fourth data DQ<1:4>. The first to $M^{th}$ command signals CMD<1:M>, the first to $N^{th}$ address signals ADD<1:N>, and the first to fourth data DQ<1:4> may be transmitted through lines that transmit at least one group of addresses, commands and data. The numbers 'M' and 'N' of bits of the first to $M^{th}$ command signals CMD<1: M> and the first to $N^{th}$ address signals ADD<1:N> may be set to be natural numbers. Although FIG. 1 illustrates an example in which the number of bits of the first to fourth data DQ<1:4> is set to be four, the present disclosure is not limited thereto. For example, the number of bits of the data may be set to be different from four according to the embodiments.

The control circuit 10 may generate a control signal WCTR and first and second shifting signals SFT<1:2>, if the first to $N^{th}$ address signals ADD<1:N> having a certain combination are inputted to the control circuit 10 by a predetermined number of times or more according to combinations of the first to $M^{th}$ command signals CMD<1:M> during a write operation. The control circuit 10 may generate the control signal WCTR including a pulse which is generated if the first to $N^{th}$ address signals ADD<1:N> having the certain combination are inputted to the control circuit 10 by the predetermined number of times or more according to the combinations of the first to $M^{th}$ command signals CMD<1:M> during the write operation. The control circuit 10 may generate the first and second shifting signals SFT<1:2> which are counted if the first to $N^{th}$ address signals ADD<1:N> having the certain combination are inputted to the control circuit 10 by the predetermined number of times or more according to the combinations of the first to $M^{th}$ command signals CMD<1:M> during the write operation. Although FIG. 1 illustrates an example in which the number of bits of the first and second shifting signals SFT<1:2> is set to be two, the present disclosure is not limited thereto. For example, the number of bits of the shifting signals may be set to be different from two according to the embodiments.

The data I/O circuit 20 may include an error correction circuit 21 and a data conversion circuit 22.

The error correction circuit 21 may detect errors of the first to fourth data DQ<1:4> and may correct the errors of the first to fourth data DQ<1:4> to generate first to fourth correction data ECD<1:4>, during the write operation. The error correction circuit 21 may generate first and second parity signals ECP<1:2> including error information on the first to fourth data DQ<1:4>, during the write operation. The error correction circuit 21 may correct errors of first to fourth output data DO<1:4> included in first to sixth output data DO<1:6> in response to first and second parity signals ECP<1:2> included in the first to sixth output data DO<1:6> to output the corrected output data as the first to fourth data DQ<1:4>, during a read operation. The error correction circuit 21 may be realized using a general error correction code (ECC) circuit. The number of bits of the first and second parity signals ECP<1:2> may be set to be different according to the embodiments.

The data conversion circuit 22 may shift the first to fourth correction data ECD<1:4> and the first and second parity signals ECP<1:2> to generate first to eighth internal data ID<1:8> in response to the control signal WCTR during the write operation. The data conversion circuit 22 may restore positions of the first to fourth correction data ECD<1:4> and the first and second parity signals ECP<1:2> included in the first to eighth internal data ID<1:8> to generate the first to sixth output data DO<1:6> in response to the first and second shifting signals SFT<1:2> during the read operation. The first to eighth internal data ID<1:8> may include the first to fourth correction data ECD<1:4>, the first and second parity signals ECP<1:2>, and the first and second shifting signals SFT<1:2>. An operation that the data conversion circuit 22 shifts the first to fourth correction data ECD<1:4> and the first and second parity signals ECP<1:2> to generate the first to eighth internal data ID<1:8> in response to the control signal WCTR will be described later. The positions of the first to fourth correction data ECD<1:4>, the first and second parity signals ECP<1:2>, and the first and second shifting signals SFT<1:2> included in the first to eighth internal data ID<1:8> will be described in later.

That is, the data I/O circuit 20 may shift the first to fourth data DQ<1:4> and the error information to generate the first to eighth internal data ID<1:8> in response to a pulse of the control signal WCTR during the write operation. The data I/O circuit 20 may restore the positions of the first to fourth data DQ<1:4> and the error information included in the first to eighth internal data ID<1:8> in response to the first and second shifting signals SFT<1:2> and may correct the errors of the first to eighth internal data ID<1:8> using the error information to output the corrected internal data as the first to fourth data DQ<1:4>, during the read operation. The error information may be set to correspond to the first and second parity signals ECP<1:2>.

The memory area 30 may store the first to eighth internal data ID<1:8> in a page which is selected according to a combination of the first to $N^{th}$ address signals ADD<1:N> during the write operation. The memory area 30 may output the first to eighth internal data ID<1:8> stored in the page which is selected by the combination of the first to $N^{th}$ address signals ADD<1:N> during the read operation. The memory area 30 may be realized using a nonvolatile memory device including multiple pages or using a volatile memory device including multiple memory cell arrays according to the embodiments.

The second semiconductor device 2 having an aforementioned configuration may correct errors of the first to fourth data DQ<1:4> in response to the first to $M^{th}$ command signals CMD<1:M> during the write operation. The second semiconductor device 2 may store the corrected data of the first to fourth data DQ<1:4> and the error information of the first to fourth data DQ<1:4> in the page which is selected according to the first to $N^{th}$ address signals ADD<1:N>. The second semiconductor device 2 may shift the first to fourth data DQ<1:4> and the error information of the first to fourth data DQ<1:4> to store the shifted data in the page in response to the first to $M^{th}$ command signals CMD<1:M>, if the first to $N^{th}$ address signals ADD<1:N> having the certain combination are inputted to the second semiconductor device 2 by a predetermined number of times or more, during the write operation. The second semiconductor device 2 may restore the positions of the first to fourth data DQ<1:4> and the error information of the first to fourth data DQ<1:4> stored in the page in response to the first to $M^{th}$ command signals CMD<1:M> during the read operation. The second semiconductor device 2 may correct the errors of the first to fourth data DQ<1:4> using the failure information to output the corrected data in response to the first to $M^{th}$ command signals CMD<1:M> during the read operation.

Figure 2:
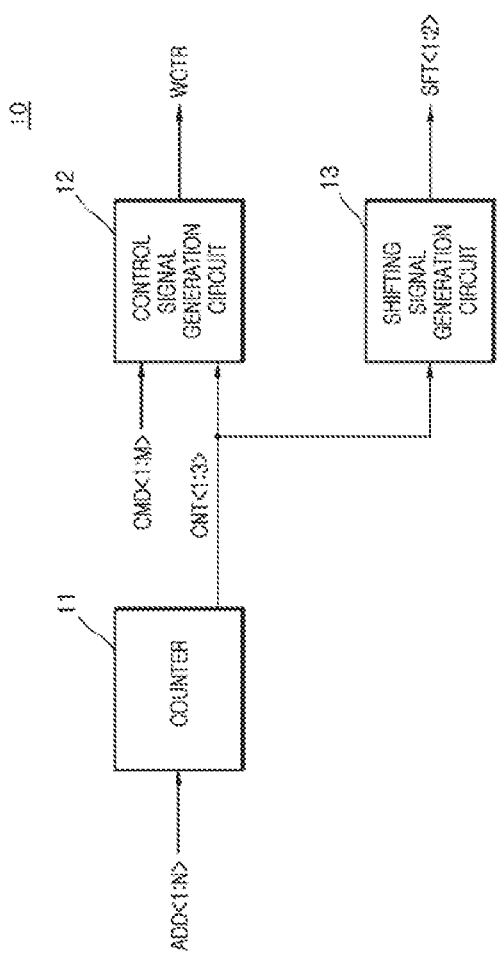
FIG. 2 is a block diagram illustrating a representation of an example of a configuration of a control circuit included in the semiconductor system of FIG. 1.

Referring to FIG. 2, the control circuit 10 may include a counter 11, a control signal generation circuit 12, and a shifting signal generation circuit 13.

The counter 11 may generate first to third counting signals CNT<1:3> which are counted whenever the first to $N^{th}$ address signals ADD<1:N> having the certain combination are inputted to the counter 11. FIG. 2 illustrates an example in which the counter 11 is a single counter, but the counter 11 may be configured to include the same number of counters as the pages to estimate the sameness of various combinations of the first to $N^{th}$ address signals ADD<1:N>. FIG. 2 illustrates an example in which the number of bits of the first to third counting signals CNT<1:3> is set to be three, the present disclosure is not limited thereto. For example, the number of bits of the counting signals may be set to be different from three according to the embodiments.

An operation of the counter 11 will be described more hereinafter in conjunction with an example in which the first to $N^{th}$ address signals ADD<1:N> having the certain combination are inputted to the counter 11 four times.

If the first to $N^{th}$ address signals ADD<1:N> having a certain combination are inputted the counter 11 four times, the counter 11 may count up the first to third counting signals CNT<1:3> having a logic low level (L) to generate the first counting signal CNT<1> having a logic low level (L), the second counting signal CNT<2> having a logic low level (L), and the third counting signal CNT<3> having a logic high level (H). The counter 11 may be realized using a general counter generating the first to third counting signals CNT<1:3> which are counted up or counted down whenever the first to third counting signals CNT<1:3> having the certain combination are inputted to the counter 11.

The control signal generation circuit 12 may generate the control signal WCTR including a pulse which is generated whenever the first to third counting signals CNT<1:3> are counted a predetermined number of times or more, in response to the first to $M^{th}$ command signals CMD<1:M> during the write operation.

For example, the control signal generation circuit 12 may generate the control signal WCTR including a pulse which is generated when the first to third counting signals CNT<1:3> are counted four times. In addition, the control signal generation circuit 12 may generate the control signal WCTR including the pulse which is generated whenever the first to third counting signals CNT<1:3> are counted up four times or more. That is, the control signal generation circuit 12 may generate the control signal WCTR including the pulses which are generated when the first to third counting signals CNT<1:3> are counted four times, five times, six times and seven times.

The shifting signal generation circuit 13 may generate the first and second shifting signals SFT<1:2> which are counted whenever the first to third counting signals CNT<1:3> are counted a predetermined number of times or more. The first and second shifting signals SFT<1:2> may include shifting information of the first to fourth correction data ECD<1:4> and the first and second parity signals ECP<1:2>.

For example, the shifting signal generation circuit 13 may generate the first and second shifting signals SFT<1:2> which are sequentially counted up from a point of time that the first to third counting signals CNT<1:3> are counted four times. The shifting signal generation circuit 13 may generate the first and second shifting signals SFT<1:2> which are counted up when the first to third counting signals CNT<1:3> are counted up four times, five times, six times and seven times.

For example, if the first to third counting signals CNT<1:3> are counted four times, the shifting signal generation circuit 13 may generate the first shifting signal SFT<1> having a logic low level (L) and the second shifting signal SFT<2> having a logic low level (L). If the first to third counting signals CNT<1:3> are counted seven times, the shifting signal generation circuit 13 may generate the first shifting signal SFT<1> having a logic high level (H) and the second shifting signal SFT<2> having a logic high level (H).

Figure 3:
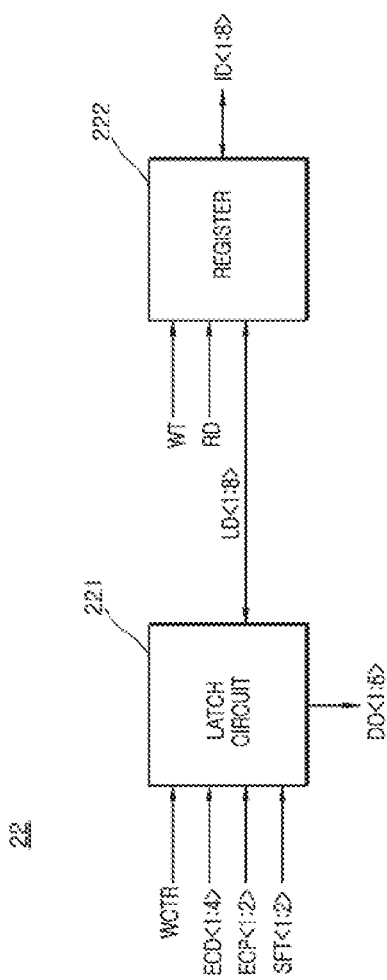
FIG. 3 is a block diagram illustrating a representation of an example of a configuration of a data conversion circuit included in the semiconductor system of FIG. 1.

Referring to FIG. 3, the data conversion circuit 22 may include a latch circuit 221 and a register 222.

The latch circuit 221 may shift the first to fourth correction data ECD<1:4> and the first and second parity signals ECP<1:2> in response to the pulse of the control signal WCTR. The latch circuit 221 may output the shifted first to fourth correction data ECD<1:4>, the shifted first and second parity signals ECP<1:2>, and the first and second shifting signals SFT<1:2> as first to eighth latch data LD<1:8>. The latch circuit 221 may restore storage positions of the first to fourth correction data ECD<1:4> and the first and second parity signals ECP<1:2> to output the restored data and the restored parity signals as first to sixth output data DO<1:6> based on the first and second shifting signals SFT<1:2> included in the first to eighth latch data LD<1:8> during the read operation.

The register 222 may output the first to eighth latch data LD<1:8> as first to eighth internal data ID<1:8> in response to a write signal WT which is inputted during the write operation. The register 222 may output the first to eighth internal data ID<1:8> as the first to eighth latch data LD<1:8> in response to a read signal RD which is inputted during the read operation.

The first to eighth latch data LD<1:8> generated by the latch circuit 221 will be described hereinafter with reference to FIG. 4.

First, if the control signal WCTR is not inputted, the first latch data LD<1> may be the first correction data ECD<1>, the second latch data LD<2> may be the second correction data ECD<2>, the third latch data LD<3> may be the third correction data ECD<3>, the fourth latch data LD<4> may be the fourth correction data ECD<4>, the fifth latch data LD<5> may be the first parity signal ECP<1>, the sixth latch data LD<6> may be the second parity signal ECP<2>, the seventh latch data LD<7> may be the first shifting signal SFT<1>, and the eighth latch data LD<8> may be the second shifting signal SFT<2>. Here, if the control signal WCTR is not inputted, the first to fourth correction data ECD<1:4> and the first and second parity signals ECP<1:2> are not shifted.

Next, if the control signal WCTR is inputted once, the first latch data LD<1> may be the second parity signal ECP<2>, the second latch data LD<2> may be the first correction data ECD<1>, the third latch data LD<3> may be the second correction data ECD<2>, the fourth latch data LD<4> may be the third correction data ECD<3>, the fifth latch data LD<5> may be the fourth correction data ECD<4>, the sixth latch data LD<6> may be the first parity signal ECP<1>, the seventh latch data LD<7> may be the first shifting signal SFT<1>, and the eighth latch data LD<8> may be the second shifting signal SFT<2>. Here, if the control signal WCTR is inputted once, the first to fourth correction data ECD<1:4> and the first and second parity signals ECP<1:2> may be shifted once.

Next, if the control signal WCTR is inputted twice, the first latch data LD<1> may be the first parity signal ECP<1>, the second latch data LD<2> may be the second parity signal ECP<2>, the third latch data LD<3> may be the first correction data ECD<1>, the fourth latch data LD<4> may be the second correction data ECD<2>, the fifth latch data LD<5> may be the third correction data ECD<3>, the sixth latch data LD<6> may be the fourth correction data ECD<4>, the seventh latch data LD<7> may be the first shifting signal SFT<1>, and the eighth latch data LD<8> may be the second shifting signal SFT<2>. Here, if the control signal WCTR is inputted twice, the first to fourth correction data ECD<1:4> and the first and second parity signals ECP<1:2> may be shifted twice.

Next, if the control signal WCTR is inputted three times, the first latch data LD<1> may be the fourth correction data ECD<4>, the second latch data LD<2> may be the first parity signal ECP<1>, the third latch data LD<3> may be the second parity signal ECP<2>, the fourth latch data LD<4> may be the first correction data ECD<1>, the fifth latch data LD<5> may be the second correction data ECD<2>, the sixth latch data LD<6> may be the third correction data ECD<3>, the seventh latch data LD<7> may be the first shifting signal SFT<1>, and the eighth latch data LD<8> may be the second shifting signal SFT<2>. Here, if the control signal WCTR is inputted three times, the first to fourth correction data ECD<1:4> and the first and second parity signals ECP<1:2> may be shifted three times.

Next, if the control signal WCTR is inputted four times, the first latch data LD<1> may be the third correction data ECD<3>, the second latch data LD<2> may be the fourth correction data ECD<4>, the third latch data LD<3> may be the first parity signal ECP<1>, the fourth latch data LD<4> may be the second parity signal ECP<2>, the fifth latch data LD<5> may be the first correction data ECD<1>, the sixth latch data LD<6> may be the second correction data ECD<2>, the seventh latch data LD<7> may be the first shifting signal SFT<1>, and the eighth latch data LD<8> may be the second shifting signal SFT<2>. Here, if the control signal WCTR is inputted four times, the first to fourth correction data ECD<1:4> and the first and second parity signals ECP<1:2> may be shifted four times.

The latch circuit 221 may shift the first to fourth correction data ECD<1:4> and the first and second parity signals ECP<1:2> once to output the shifted correction data and the shifted parity signals as the first to sixth latch data LD<1:6> and may output the first and second shifting signals SFT<1:2> as the seventh and eighth latch data LD<7:8>, whenever the pulse of the control signal WCTR is inputted to the latch circuit 221.

Figure 5:
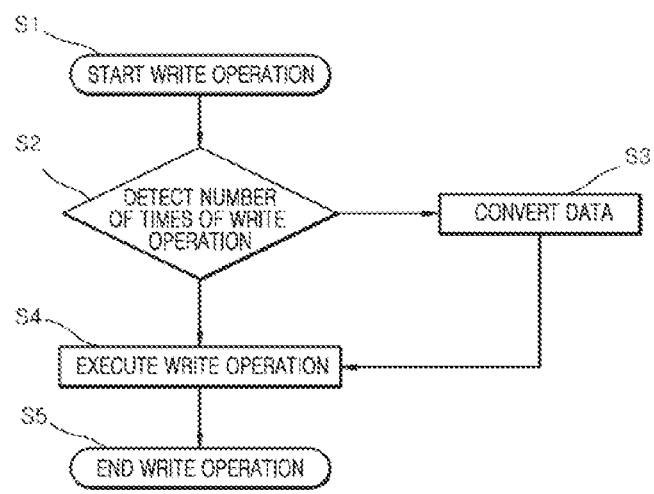
FIG. 5 is a flowchart illustrating a representation of an example of a method of inputting and outputting data according to an embodiment of the present disclosure.

A write operation of the semiconductor system according to an embodiment of the present disclosure will be described hereinafter with reference to FIG. 5 in conjunction with an example in which a predetermined number of times that the first to $N^{th}$ address signals ADD<1:N> having a certain combination are inputted is set to be four and a total number of times that the first to $N^{th}$ address signals ADD<1:N> having the certain combination are inputted is set to be five during the write operation.

First, if the write operation starts, the first semiconductor device 1 may output the first to $M^{th}$ command signals CMD<1:M> and the first to $N^{th}$ address signals ADD<1:N> for executing the write operation (see a step S1). At this time, the first to $N^{th}$ address signals ADD<1:N> having the certain combination may be outputted from the first semiconductor device 1 five times.

Subsequently, the number of times that the first to $N^{th}$ address signals ADD<1:N> having the certain combination are inputted may be detected, and the detected number of times may be compared with four corresponding to the predetermined number of times (see a step S2). If the detected number of times is less than four, the write operation may be executed and may terminate (see steps S4 and S5). If the detected number of times is five, the counter 11 of the control circuit 10 may count up the first to third counting signals CNT<1:3> five times to generate the first counting signal CNT<1> having a logic high level, the second counting signal CNT<2> having a logic low level, and the third counting signal CNT<3> having a logic high level.

The control signal generation circuit 12 of the control circuit 10 may generate a pulse of the control signal WCTR at a point of time that the first to third counting signals CNT<1:3> are counted up four times (corresponding to the predetermined number of times) and may generate another pulse of the control signal WCTR at a point of time that the first to third counting signals CNT<1:3> are counted up five times, in response to the first to $M^{th}$ command signals CMD<1:M>. That is, the pulse of the control signal WCTR may be generated twice.

The shifting signal generation circuit 13 of the control circuit 10 may count up the first and second shifting signals SFT<1:2> to generate the first shifting signal SFT<1> having a logic high level and the second shifting signal SFT<2> having a logic low level, at a point of time that the first to third counting signals CNT<1:3> are counted up five times.

The error correction circuit 21 may detect errors of the first to fourth data DQ<1:4> and may correct the errors of the first to fourth data DQ<1:4> to generate the first to fourth correction data ECD<1:4> and to generate the first and second parity signals ECP<1:2> including error information on the first to fourth data DQ<1:4>.

Subsequently, since the pulse of the control signal WCTR is inputted twice, the latch circuit 221 of the data conversion circuit 22 may output the first parity signal ECP<1>, the second parity signal ECP<2>, the first correction data ECD<1>, the second correction data ECD<2>, the third correction data ECD<3>, the fourth correction data ECD<4>, the first shifting signal SFT<1>, and the second shifting signal SFT<2> as the first latch data LD<1>, the second latch data LD<2>, the third latch data LD<3>, the fourth latch data LD<4>, the fifth latch data LD<5>, the sixth latch data LD<6>, the seventh latch data LD<7> and the eighth latch data LD<8>, respectively (see a step S3).

That is, as described with reference to FIG. 4, the first to sixth latch data LD<1:6> may be generated by shifting the first to fourth correction data ECD<1:4> and the first and second parity signals ECP<1:2> twice, and the seventh and eighth latch data LD<7:8> may be generated to be the first and second shifting signals SFT<1:2>.

Subsequently, the register 222 of the data conversion circuit 22 may output the first to eighth latch data LD<1:8> as the first to eighth internal data ID<1:8> in response to the write signal WT (see the step S4).

The memory area 30 may store the first to eighth internal data ID<1:8> in a page which is selected by the first to $N^{th}$ address signals ADD<1:N> (also see the step S4).

Subsequently, the write operation may terminate (see the step S5).

The semiconductor system having an aforementioned configuration may shift storage positions of the data and the parity signals and may store the data and the parity signals into the shifted storage positions to enhance the reliability of the parity signals, if a certain page is selected a predetermined number of times or more to store the data and the parity signals into the certain page. In addition, since the storage positions of the data and the parity signals are shifted and the data and the parity signals are stored into the shifted storage positions, degradation of memory cells storing the parity signals whose errors occur more frequently than the data may be prevented.

Figure 6:
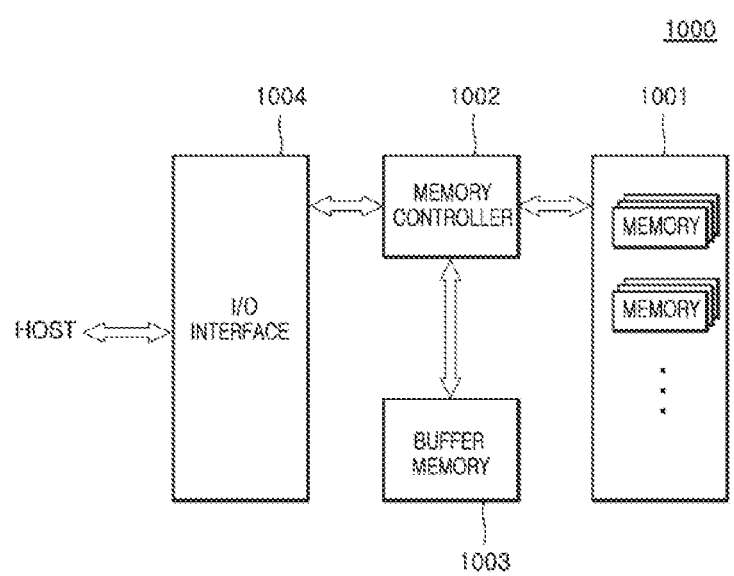
FIG. 6 is a block diagram illustrating a representation of an example of a configuration of an electronic system employing the semiconductor device or the semiconductor system illustrated in FIG. 1 to FIG. 5.

The semiconductor devices or the semiconductor systems described with reference to FIGS. 1 to 5 may be applied to an electronic system that includes a memory system, a graphic system, a computing system, a mobile system, or the like. For example, as illustrated in FIG. 6, an electronic system 1000 according an embodiment may include a data storage circuit 1001, a memory controller 1002, a buffer memory 1003, and an input/output (I/O) interface 1004.

The data storage circuit 1001 may store data which are outputted from the memory controller 1002 or may read and output the stored data to the memory controller 1002, according to a control signal generated from the memory controller 1002. The data storage circuit 1001 may include a second semiconductor device 2 illustrated in FIG. 1. The data storage circuit 1001 may include a nonvolatile memory that can retain their stored data, even if its power supply is interrupted. The nonvolatile memory may be a flash memory such as a NOR-type flash memory or a NAND-type flash memory, a phase change random access memory (PRAM), a resistive random access memory (RRAM), a spin transfer torque random access memory (STTRAM), a magnetic random access memory (MRAM), or the like.

The memory controller 1002 may receive a command outputted from an external device (e.g., a host device) through the I/O interface 1004 and may decode the command outputted from the host device to control an operation for inputting data into the data storage circuit 1001 or the buffer memory 1003 or for outputting the data stored in the data storage circuit 1001 or the buffer memory 1003. The memory controller 1002 may include a first semiconductor device 1 illustrated in FIG. 1. Although FIG. 6 illustrates the memory controller 1002 with a single block, the memory controller 1002 may include one controller for controlling the data storage circuit 1001 comprised of a nonvolatile memory and another controller for controlling the buffer memory 1003 comprised of a volatile memory.

The buffer memory 1003 may temporarily store the data which are processed by the memory controller 1002. That is, the buffer memory 1003 may temporarily store the data which are outputted from or to be inputted to the data storage circuit 1001. The buffer memory 1003 may store the data, which are outputted from the memory controller 1002, according to a control signal. The buffer memory 1003 may read and output the stored data to the memory controller 1002. The buffer memory 1003 may include a volatile memory such as a dynamic random access memory (DRAM), a mobile DRAM, or a static random access memory (SRAM).

The I/O interface 1004 may physically and electrically connect the memory controller 1002 to the external device (i.e., the host). Thus, the memory controller 1002 may receive control signals and data supplied from the external device (i.e., the host) through the I/O interface 1004 and may output the data generated from the memory controller 1002 to the external device (i.e., the host) through the I/O interface 1004. That is, the electronic system 1000 may communicate with the host through the I/O interface 1004. The I/O interface 1004 may include any one of various interface protocols such as a universal serial bus (USB), a multi-media card (MMC), a peripheral component interconnect-express (PCI-E), a serial attached SCSI (SAS), a serial AT attachment (SATA), a parallel AT attachment (PATA), a small computer system interface (SCSI), an enhanced small device interface (ESDI) and an integrated drive electronics (IDE).

The electronic system 1000 may be used as an auxiliary storage device of the host or an external storage device. The electronic system 1000 may include a solid state disk (SSD), a USB memory, a secure digital (SD) card, a mini secure digital (mSD) card, a micro secure digital (micro SD) card, a secure digital high capacity (SDHC) card, a memory stick card, a smart media (SM) card, a multi-media card (MMC), an embedded multi-media card (eMMC), a compact flash (CF) card, or the like.

Figure 7:
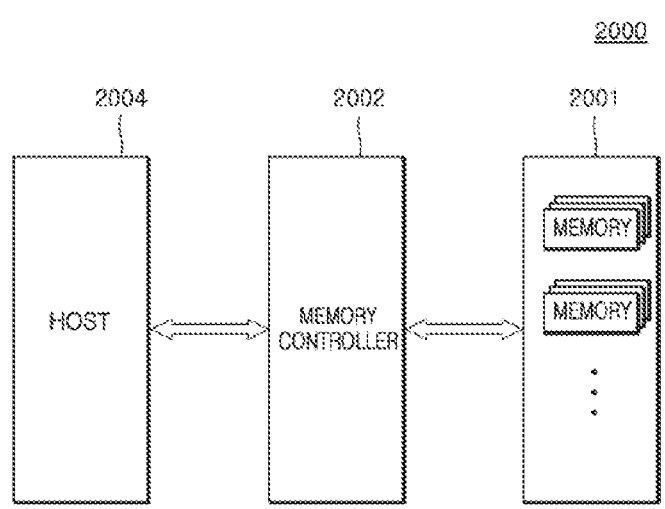
FIG. 7 is a block diagram illustrating a representation of an example of a configuration of an electronic system employing the semiconductor device or the semiconductor system illustrated in FIG. 1 to FIG. 5.

Referring to FIG. 7, an electronic system 2000 according to an embodiment of the present disclosure may include a host 2004, a memory controller 2002, and a data storage circuit 2001.

The host 2004 may output a request signal and data to the memory controller 2002 to access the data storage circuit 2001. The memory controller 2002 may supply the data, a data strobe signal, a command, addresses and a clock signal to the data storage circuit 2001 in response to the request signal, and the data storage circuit 2001 may execute a write operation or a read operation in response to the command. The host 2004 may transmit the data to the memory controller 2002 to store the data into the data storage circuit 2001. In addition, the host 2004 may receive the data outputted from the data storage circuit 2001 through the memory controller 2002. The host 2004 may include a circuit that corrects errors of the data using an error correction code (ECC) scheme.

The memory controller 2002 may act as an interface that connects the host 2004 to the data storage circuit 2001 for communication between the host 2004 and the data storage circuit 2001. The memory controller 2002 may receive the request signal and the data outputted from the host 2004 and may generate and supply the data, the data strobe signal, the command, the addresses and the clock signal to the data storage circuit 2001 in order to control operations of the data storage circuit 2001. In addition, the memory controller 2002 may supply the data outputted from the data storage circuit 2001 to the host 2004.

The data storage circuit 2001 may include a plurality of memories. The data storage circuit 2001 may receive the data, the data strobe signal, the command, the addresses and the clock signal from the memory controller 2002 to execute the write operation or the read operation. Each of the memories included in the data storage circuit 2001 may include a circuit that corrects the errors of the data using an error correction code (ECC) scheme.

In some embodiments, the electronic system 2000 may be realized to selectively operate any one of the ECC circuits included in the host 2004 and the data storage circuit 2001. Alternatively, the electronic system 2000 may be realized to simultaneously operate all of the ECC circuits included in the host 2004 and the data storage circuit 2001. The host 2004 and the memory controller 2002 may be realized in a signal chip according to the embodiments. The memory controller 2002 and the data storage circuit 2001 may be realized in a signal chip according to the embodiments.

What is claimed is:

1. A semiconductor system comprising:
a first semiconductor device configured to output command signals and address signals and configured to receive or output data; and
a second semiconductor device configured to perform a write operation based on the command signals, configured to correct errors of the data to generate correction data and error information, and configured to latch the correction data and error information,
wherein, when the address signals having a certain combination are inputted a predetermined number of times or more, the second semiconductor device shifts storage positions of the correction data and the error information to generate latch data having shifted storage positions and store the data into the shifted storage positions of a page if the address signals having the certain combination are inputted the predetermined number of times or more, and
wherein the latch data is stored as internal data in the page of the second semiconductor device in performing the write operation.

2. The system of claim 1, wherein the second semiconductor device stores the latch data as the internal data in the page without shifting the storage positions of the correction data and the error information, when the address signals having the certain combination are inputted by a number of times less than the predetermined number of times, during the write operation.

3. The system of claim 1, wherein the second semiconductor device restores the storage positions of the correction data and the error information for generating restored data and restored parity signals as output data and corrects errors of the restored data of the output data using the error information to output corrected data, during a read operation.

4. The system of claim 1, wherein the second semiconductor device includes:
  a control circuit configured to generate a control signal including a pulse which is generated when the address signals having the certain combination are inputted the predetermined number of times or more and to generate shifting signals which are counted when the address signals having the certain combination are inputted the predetermined number of times or more, based on the command signal during the write operation; and
  a data input/output (I/O) circuit configured to shift the storage positions of the correction data and the error information to generate the latch data, based on the pulse of the control signal.

5. The system of claim 4, wherein the internal data includes the correction data, the error information, and the shifting signals.

6. The system of claim 4, wherein the data I/O circuit restores the storage positions of the correction data and the error information included in the internal data based on the shifting signals and corrects errors of the internal data using the error information to output the corrected internal data as the data, during a read operation.

7. The system of claim 4, wherein the control circuit includes:
  a counter configured to generate counting signals which are counted whenever the address signals having the certain combination are inputted;
  a control signal generation circuit configured to generate the control signal including a pulse which is generated when the counting signals are counted the predetermined number of times or more, based on the command signal; and
  a shifting signal generation circuit configured to generate the shifting signals based on a number of the counting signals counted the predetermined number of times or more, and
  wherein logic levels of the shifting signals are based on the number of the counting signal counted.

8. The system of claim 4, wherein the data I/O circuit includes:
  an error correction circuit configured to detect the errors of the data, configured to correct the errors of the data to generate correction data, and configured to generate a parity signal including the error information on the data, during the write operation; and
  a data conversion circuit configured to shift the storage positions of the correction data and the parity signal to generate the internal data based on the control signal.

9. The system of claim 8,
  wherein the error correction circuit corrects errors of output data to output the corrected output data as the data based on the parity signal during a read operation, and
  wherein the data conversion circuit restores the storage positions of the correction data and the parity signal included in the internal data to generate the output data based on the shifting signals during the read operation.

10. The system of claim 8, wherein the data conversion circuit includes:
  a latch circuit configured to shift the correction data and the parity signal by the number of times that a pulse of the control signal is inputted and configured to output the shifted correction data, the shifted parity data, and the shifting signals as the latch data; and
  a register configured to output the latch data as the internal data based on a write signal.

11. The system of claim 10,
  wherein the latch circuit restores the storage positions of the correction data and the parity signal to output the restored data and the restored parity signal as the output data based on the shifting signals included in the latch data during a read operation, and
  wherein the register outputs the internal data as the latch data based on a read signal.

12. The system of claim 3, wherein the second semiconductor device further includes a memory area configured to store the internal data in the page which is selected by the certain combination of the address signals during the write operation and configured to output the internal data stored in the page which is selected by the certain combination of the address signals during the read operation.

* * * * *